(12) United States Patent
Chang et al.

(10) Patent No.: US 9,978,755 B2
(45) Date of Patent: May 22, 2018

(54) METHODS AND DEVICES FOR INTRA-CONNECTION STRUCTURES

(71) Applicant: Taiwan Semiconductor Manufacturing Company Limited, Hsinchu (TW)

(72) Inventors: Feng-Ming Chang, Hsinchu County (TW); Huai-Ying Huang, New Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 93 days.

(21) Appl. No.: 14/331,328

(22) Filed: Jul. 15, 2014

(65) Prior Publication Data

US 2015/0333074 A1 Nov. 19, 2015

Related U.S. Application Data

(63) Continuation-in-part of application No. 14/278,375, filed on May 15, 2014.

(51) Int. Cl.
*H01L 27/11* (2006.01)
*H01L 29/423* (2006.01)
(Continued)

(52) U.S. Cl.
CPC .... *H01L 27/1104* (2013.01); *H01L 21/28008* (2013.01); *H01L 21/76895* (2013.01); *H01L 21/76897* (2013.01); *H01L 23/485* (2013.01); *H01L 27/0207* (2013.01); *H01L 29/4232* (2013.01); *H01L 29/66477* (2013.01); *H01L 2924/0002* (2013.01)

(58) Field of Classification Search
None
See application file for complete search history.

(56) References Cited

U.S. PATENT DOCUMENTS 4,951,112 A * 8/1990 Choi ................ G11C 11/412
257/380
6,274,409 B1 * 8/2001 Choi ................ H01L 21/76895
257/E21.507
(Continued)

FOREIGN PATENT DOCUMENTS

JP 2007103862 4/2007
JP 2007109973 4/2007
(Continued)

OTHER PUBLICATIONS

Korean Office Action; Application No. 10-2014-0163695; dated Nov. 30, 2015.
(Continued)

*Primary Examiner* — Andres Munoz
(74) *Attorney, Agent, or Firm* — Jones Day

(57) ABSTRACT

A device includes a source/drain region, a gate electrode, and an intra-connection structure. The gate electrode has a top surface, a bottom surface that is opposite to the top surface thereof, and a sidewall that extends between the top and bottom surfaces thereof. The intra-connection structure is coupled electrically to the source/drain region and the sidewall of the gate electrode. A method for fabricating the device is also disclosed.

21 Claims, 10 Drawing Sheets

(51) Int. Cl.
*H01L 29/66* (2006.01)
*H01L 21/28* (2006.01)
*H01L 27/02* (2006.01)
*H01L 21/768* (2006.01)
*H01L 23/485* (2006.01)

(56) References Cited

U.S. PATENT DOCUMENTS

| | | | |
|---|---|---|---|
| 7,510,960 B2* | 3/2009 | Toomey | H01L 21/76813 257/503 |
| 7,633,126 B2* | 12/2009 | Matsui | H01L 21/76895 257/344 |
| 2007/0080423 A1* | 4/2007 | Tsuboi | H01L 27/11 257/506 |
| 2009/0108379 A1* | 4/2009 | Oosuka | H01L 21/28525 257/412 |
| 2010/0237419 A1* | 9/2010 | Yang | H01L 27/0207 257/368 |
| 2010/0301422 A1* | 12/2010 | Osada | G11C 11/412 257/369 |
| 2012/0211843 A1* | 8/2012 | Jung | H01L 21/823412 257/401 |
| 2014/0103445 A1* | 4/2014 | Chiu | H01L 21/823475 257/369 |
| 2015/0061039 A1* | 3/2015 | Lim | H01L 21/28052 257/401 |

FOREIGN PATENT DOCUMENTS

| | | |
|---|---|---|
| KR | 20010076341 | 8/2001 |
| KR | 20020072844 | 9/2002 |
| KR | 20140043019 | 4/2014 |
| KR | 20140048789 | 4/2014 |

OTHER PUBLICATIONS

Korean Office Action; Application No. 10-2014-0163687; dated Aug. 21, 2015.
Korean Notice of Allowance; Application No. 10-2014-0163687; dated Nov. 27, 2015.
Korean Notice of Allowance; Application No. 10-2014-0163695; dated Dec. 26, 2016.

* cited by examiner

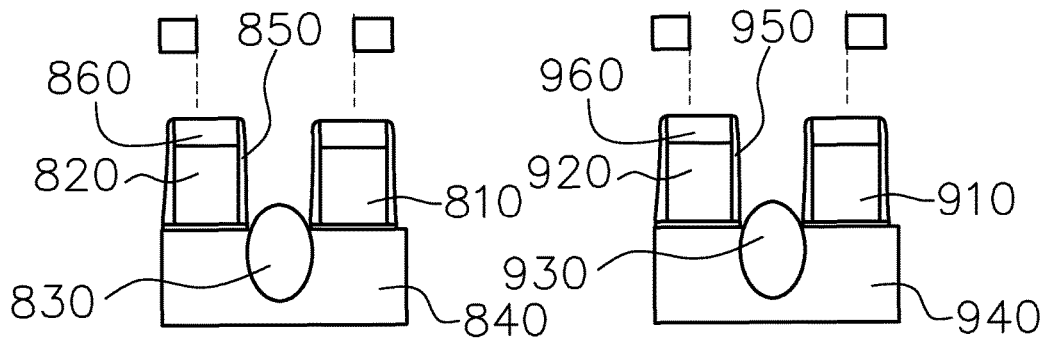
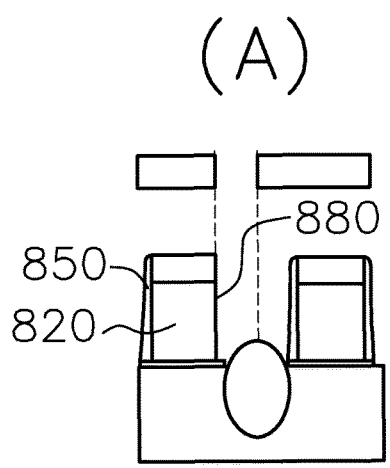
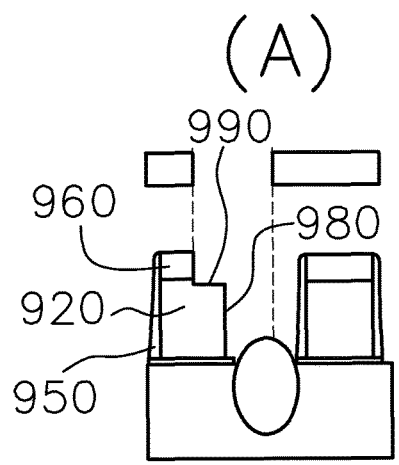
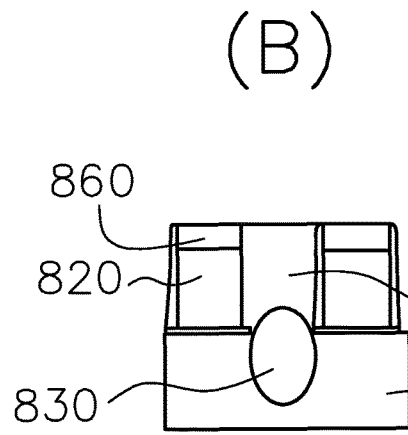
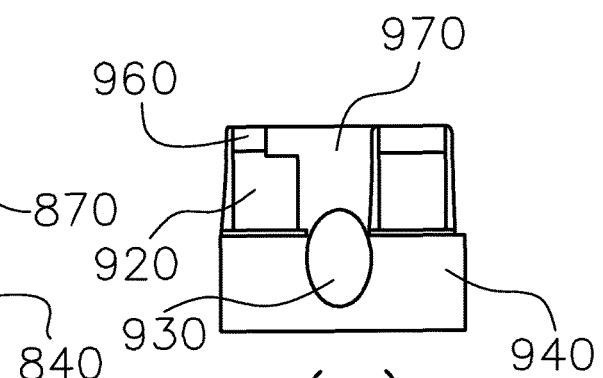
Fig. 8     Fig. 9

1208

1300

METHODS AND DEVICES FOR INTRA-CONNECTION STRUCTURES

CROSS-REFERENCE TO RELATED APPLICATIONS

This application is a continuation-in-part of U.S. patent application Ser. No. 14/278,375, entitled "Methods, Structure and Devices for Intra-connection Structures," filed May 15, 2014, which is incorporated herein by reference in its entirety.

BACKGROUND

The technology described in this disclosure relates generally to semiconductor devices and more particularly to fabrication of semiconductor devices.

Static random access memory (SRAM) devices are widely used for electronic applications where high speed, low power consumption and simple operations are needed. A SRAM device often includes a number of memory cells, and each cell may contain multiple components, such as transistors, active areas of the transistors, intra-cell connections, and contacts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8(A)-FIG. 8(C) depict fragmentary sectional views showing a process for fabricating a device including an intra-connection structure, in accordance with some embodiments.

FIG. 9(A)-FIG. 9(C) depict fragmentary sectional views showing another process for fabricating a device including an intra-connection structure, in accordance with some embodiments.

DETAILED DESCRIPTION

Figure 1:
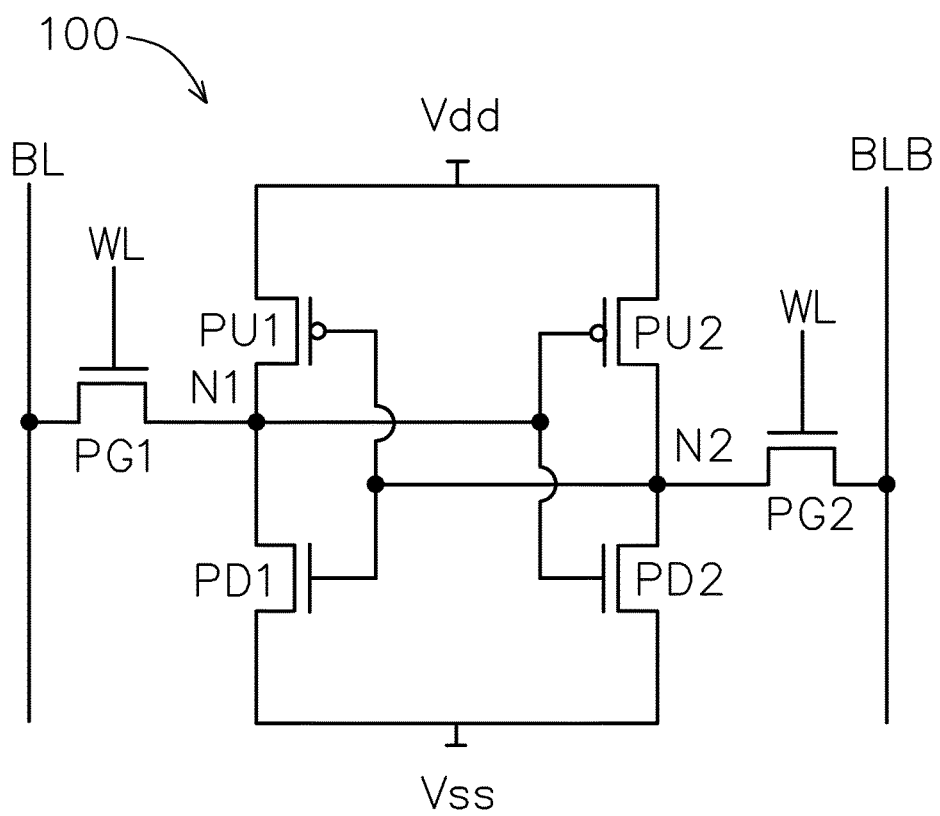
FIG. 1 depicts an example circuit diagram of a six-transistor (6-T) SRAM cell, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underneath," "below," "lower," "above," "on," "top," "bottom," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As feature sizes of semiconductor devices continue to shrink, various problems may emerge in device fabrication. For SRAM devices, as the memory cell size becomes smaller, individual components in the memory cell, such as transistors, active areas of the transistors, intra-cell connections, and contacts, would naturally need to become smaller. However, current lithography and etching techniques limit how much the individual components can be shrunk. Thus, a memory cell of a SRAM device that includes a large density of components often has overlay problems. Any overlay would lead to a short circuit between different components and may cause device failure.

FIG. 1 depicts an example circuit diagram of a six-transistor (6-T) SRAM cell 100, in accordance with some embodiments. As shown in FIG. 1, the SRAM cell 100 includes two pull-up transistors PU1 and PU2, two pull-down transistors PD1 and PD2, and two pass-gate transistors PG1 and PG2. For example, the pull-up transistors PU1 and PU2 are P-channel transistors, and the pull-down transistors PD1 and PD2 and the pass-gate transistors PG1 and PG2 are N-channel transistors. The transistors PU1, PU2, PD1, and PD2 are connected in cross-coupled inverter configuration. That is, the transistors PU1 and PD1 form a first inverter, and the transistors PU2 and PD2 form a second inverter. As shown in the circuit diagram, the drains of the pull-up transistor PU1 and the pull-down transistor PD1 are coupled together, and the drains of the pull-up transistor PU2 and the pull-down transistor PD2 are coupled together. The gates of the pull-up transistor PU1 and the pull-down transistor PD1 are coupled together and to the drains of the pull-up transistor PU2 and the pull-down transistor PD2, and the gates of the pull-up transistor PU2 and the pull-down transistor PD2 are coupled together and to the drains of the pull-up transistor PU1 and the pull-down transistor PD1. The sources of the pull-up transistors PU1 and PU2 are coupled to a power voltage Vdd, and the sources of the pull-down transistors PD1 and PD2 are coupled to a ground voltage Vss. The gates of the pass-gate transistors PG1 and PG2 are coupled to a word-line WL. A pair of complementary bit lines BL and BLB are coupled to the drains of the pass-gate transistors PG1 and PG2, respectively. The source of the pass-gate transistor PG1 is coupled to the drains of the pull-up transistor PU1 and the pull-down transistor PD1 at a node N1, and the source of the pass-gate transistor PG2 is coupled to the drains of the pull-up transistor PU2 and the pull-down transistor PD2 at another node N2. The nodes N1 and N2 are complementary nodes that are at opposite logic levels (logic high or logic low).

Figure 2:
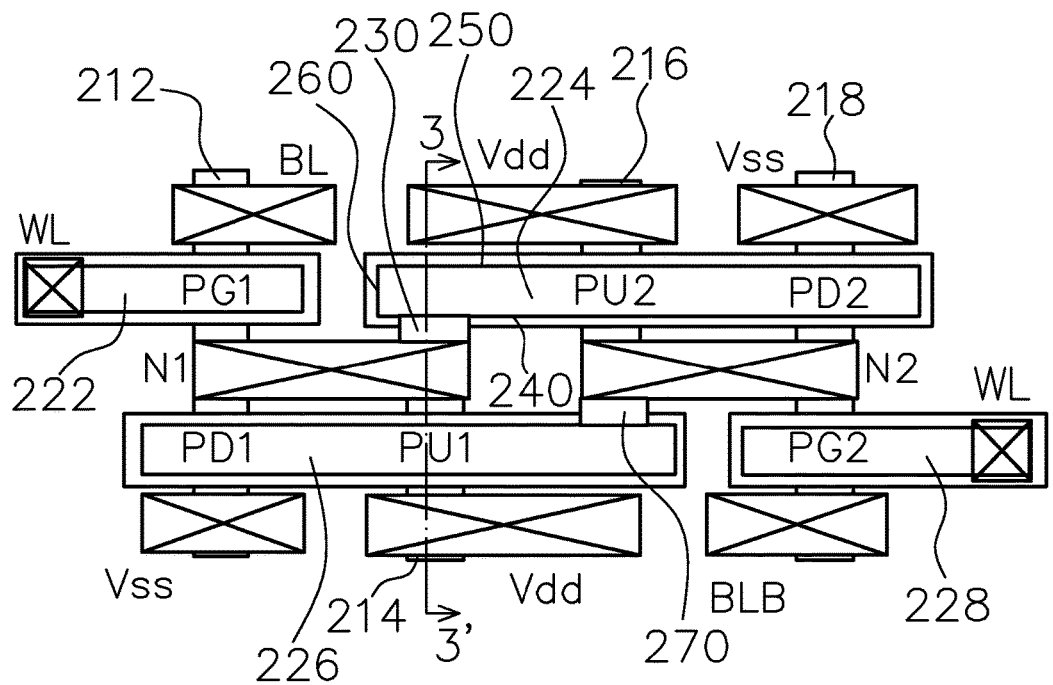
FIG. 2 depicts an example layout diagram of the SRAM cell as shown in FIG. 1, in accordance with some embodiments.

FIG. 2 depicts an example layout diagram of the SRAM cell 100 as shown in FIG. 1, in accordance with some embodiments. As shown in FIG. 2, four active areas 212, 214, 216, 218 that form source/drain regions of the transistors PU1, PU2, PD1, PD2, PG1, and PG2 extend in a first direction, and four gate patterns 222, 224, 226, 228 of the transistors PU1, PU2, PD1, PD2, PG1, and PG2 extend in a second direction transverse to the first direction.

A single gate pattern 226 is used as gate electrodes of the pull-up transistor PU1 and the pull-down transistor PD1, thereby electrically coupling the gate electrodes of the pull-up transistor PU1 and the pull-down transistor PD1, and another single gate pattern 224 is used as gate electrodes of the pull-up transistor PU2 and the pull-down transistor PD2, thereby electrically coupling the gate electrodes of the pull-up transistor PU2 and the pull-down transistor PD2.

A single source/drain pattern 212 is used as source/drain regions of the pass-gate transistor PG1 and the pull-down transistor PD1, thereby electrically coupling the source/drain regions of the pass-gate transistor PG1 and the pull-down transistor PD1, and another single source/drain pattern 218 is used as source/drain regions of the pass-gate transistor PG2 and the pull-down transistor PD2, thereby electrically coupling the source/drain regions of the pass-gate transistor PG2 and the pull-down transistor PD2.

Various contacts couple the transistors PU1, PU2, PD1, PD2, PG1, and PG2 of the SRAM cell 100. A word line contact WL is coupled to the gate electrode 222 of the pass-gate transistor PG1, and another word line contact WL is coupled to the gate electrode 228 of the pass-gate transistor PG2. A bit line contact BL is coupled to the source/drain region 212 of the pass-gate transistor PG1, and a complementary bit line contact BLB is coupled to the source/drain region 218 of the pass-gate transistor PG2. A power contact Vdd is coupled to the source/drain region 214 of the pull-up transistor PU1, and another power contact Vdd is coupled to the source/drain region 216 of the pull-up transistor PU2. A ground contact Vss is coupled to the source/drain region 212 of the pull-down transistor PD1, and another ground contact Vss is coupled to the source/drain region 218 of the pull-down transistor PD2. A node contact N1 couples together the source/drain region 214 of the pull-up transistor PU1 and the source/drain regions 212 of the pull-down transistor PD1 and the pass-gate transistor PG1, and another node contact N2 couples together the source/drain region 216 of the pull-up transistor PU2 and the source/drain regions 218 of the pass-gate transistor PG2 and the pull-down transistor PD2.

Furthermore, an intra-connection structure 270 connects the gate electrode 226 of the transistor PU1 and the source/drain region 216 of the transistor PU2 laterally, so as to avoid overlay problems associated with vertical connection structures. As the intra-connection structure 270 is disposed laterally between the gate electrode 226 and the source/drain region 216, the intra-connection structure 270 may not come into contact with the BLB contact associated with the source/drain region 218 of the transistor PG2 or the Vdd contact associated with the source/drain region 214 of the transistor PU1.

Similarly, another intra-connection structure 230 connects the gate electrode 224 of the transistor PU2 and the source/drain region 214 of the transistor PU1 laterally. As the intra-connection structure 230 is disposed laterally between the gate electrode 224 and the source/drain region 214, the intra-connection structure 230 may not come into contact with the BL contact associated with the source/drain region 212 of the transistor PG1 or the Vdd contact associated with the source/drain region 216 of the transistor PU2.

For example, the power contacts Vdd, the bit line contact BL, the complementary bit line contact BLB, and the nodes N1 and N2 include one or more conductive materials (e.g., metal-based materials). The intra-connection structures 230, 270 include one or more conductive materials (e.g., metal-based materials). The gate electrodes 222, 224, 226, 228 include one or more conductive materials (e.g., metal-based materials, polysilicon).

Figure 3:
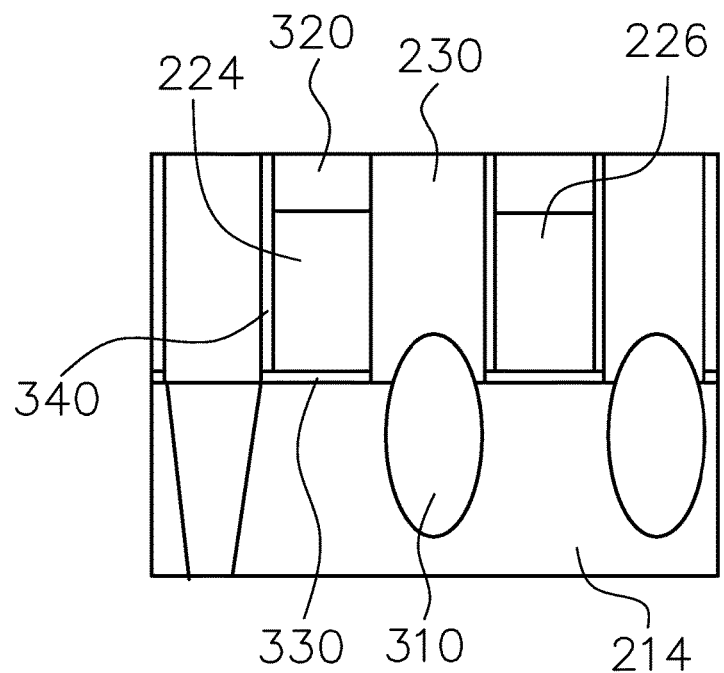
FIG. 3 depicts a cross-sectional view taken on the line labeled 3-3' as shown in FIG. 2, in accordance with some embodiments.

The intra-connection structure 230 is electrically connected to the source/drain region 214 and the gate electrode 224. Specifically, with further reference to FIG. 3, the source/drain region 214 has a raised source/drain portion 310 disposed between the gate electrode 226 and the gate electrode 224. The gate electrode 224 has a top surface, a bottom surface that is opposite to the top surface thereof, and a sidewall that extends between the top and bottom surfaces thereof. A gate insulator 320 is disposed on the top surface of the gate electrode 224. A gate dielectric 330 is disposed on the bottom surface of the gate electrode 224. A gate spacer 340 is disposed on the sidewall of the gate electrode 224.

The sidewall of the gate electrode 224 has a first sidewall portion 240, a second sidewall portion 250 that is opposite to the first sidewall portion 240 thereof, and a third sidewall portion 260 that extends between the first and second sidewall portions 240, 250 thereof. The first sidewall portion 240 has part that is free from the gate spacer 340. The intra-connection structure 230 has a top surface, a bottom surface that is opposite to the top surface thereof and that is in contact with the raised source/drain portion 310 of the source/drain region 214 and a sidewall that extends between the top and bottom surfaces thereof and that is in contact with the part of the first sidewall portion 240 of the sidewall of the gate electrode 224 that is free from the gate spacer 340. In this example, the top surface of the intra-connection structure 230 is substantially flush with a top surface of the gate insulator 320.

For example, the gate insulator 320, the gate dielectric 330, and the gate spacer 340 may, for example, include one or more dielectric materials (e.g., interfacial dielectric material, high-k dielectric material).

Figure 4:
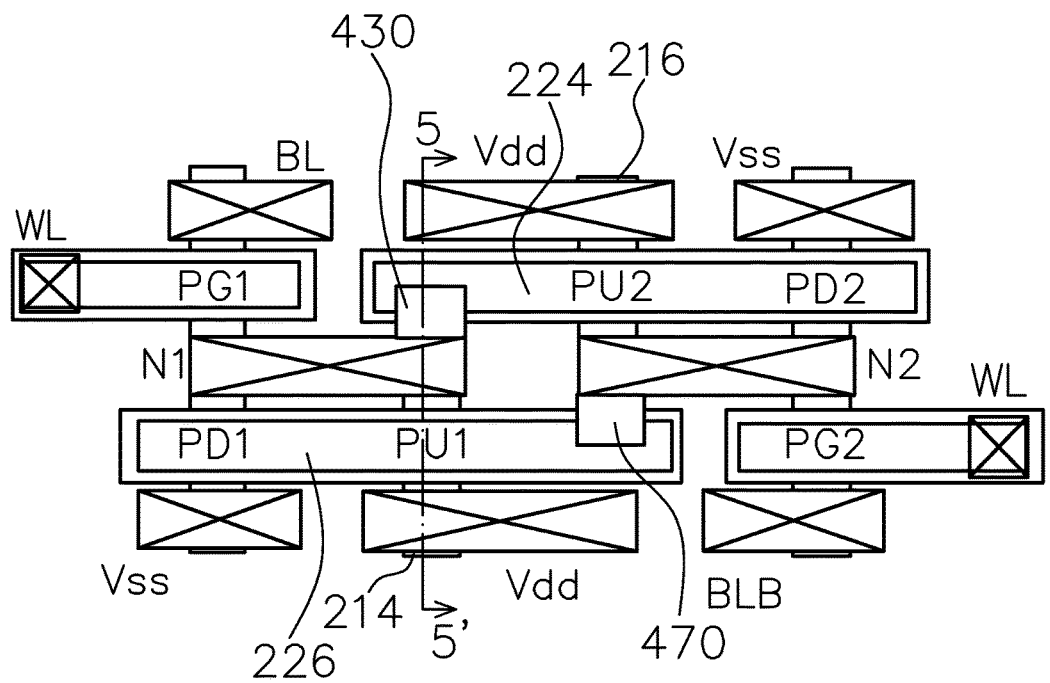
FIG. 4 depicts another example layout diagram of the SRAM cell as shown in FIG. 1, in accordance with some embodiments.

FIG. 4 depicts another example layout diagram of the SRAM cell 100 as shown in FIG. 1, in accordance with some embodiments. As shown in FIG. 4, an intra-connection structure 470 connects the gate electrode 226 of the transistor PU1 and the source/drain region 216 of the transistor PU2 laterally. Similarly, another intra-connection structure 430 connects the gate electrode 224 of the transistor PU2 and the source/drain region 214 of the transistor PU1 laterally.

Figure 5:
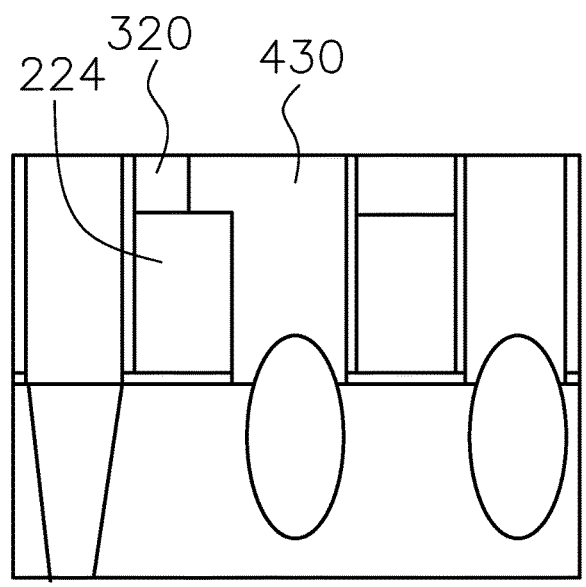
FIG. 5 depicts a cross-sectional view taken on the line labeled 5-5' as shown in FIG. 4, in accordance with some embodiments.

The intra-connection structure 430 of this example differs from the previous example intra-connection structure 230 in that the intra-connection structure 430 is further electrically connected to the top surface of the gate electrode 224. Specifically, with further reference to FIG. 5, part of the top surface of the gate electrode 224 is free from the gate insulator 320, and the sidewall of the intra-connection structure 430 is further in contact with the part of the top surface of the gate electrode 224 that is free from the gate insulator 320.

Figure 6:
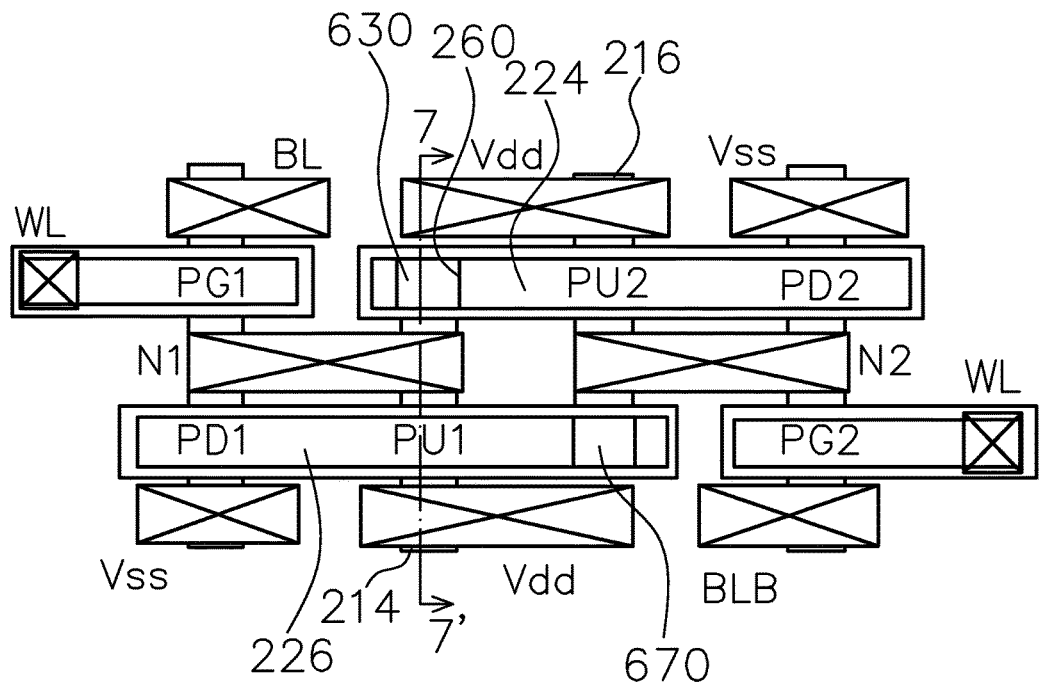
FIG. 6 depicts another example layout diagram of the SRAM cell as shown in FIG. 1, in accordance with some embodiments.

FIG. 6 depicts another example layout diagram of the SRAM cell 100 as shown in FIG. 1, in accordance with some embodiments. As shown in FIG. 6, an intra-connection structure 670 connects the gate electrode 226 of the transistor PU1 and the source/drain region 216 of the transistor PU2 laterally. Similarly, another intra-connection structure 630 connects the gate electrode 224 of the transistor PU2 and the source/drain region 214 of the transistor PU1 laterally.

Figure 7:
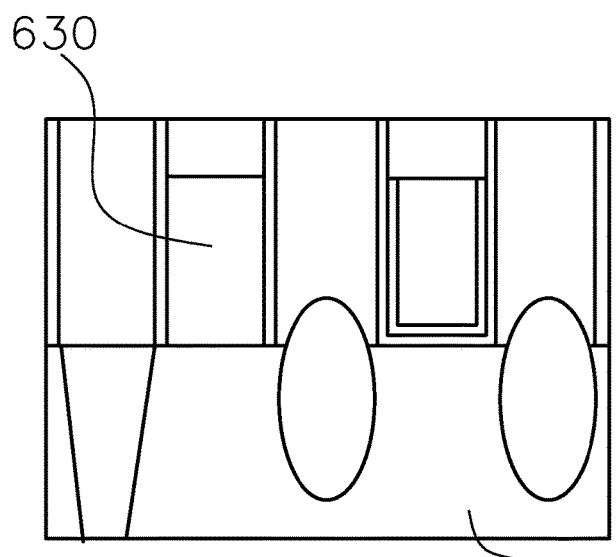
FIG. 7 depicts a cross-sectional view taken on the line labeled 7-7' as shown in FIG. 6, in accordance with some embodiments.

The intra-connection structure 630 of this example differs from the previous example intra-connection structures 230, 430 in that the intra-connection structure 630 is electrically connected to the source/drain region 214 and the third sidewall portion 260 of the sidewall of the gate electrode 224. Specifically, with further reference to FIG. 7, the bottom surface of the intra-connection structure 630 is in contact with the source/drain region 214, and the sidewall of the intra-connection structure 630 is in contact with the third sidewall portion 260 of the sidewall of the gate electrode 224.

FIG. 8(A)-FIG. 8(C) depict fragmentary sectional views showing a process for fabricating a device including an intra-connection structure, in accordance with some embodiments. One or more fabrication processes (e.g., lithography, deposition, and/or etching) may be carried out to yield a structure as shown in FIG. 8(A). For example, a sacrificial dielectric material (not shown) that is formed between gate electrodes 810, 820 (e.g., the gate electrodes 226 and 224 of the pull-up transistors PU1 and PU2, respectively) is removed (e.g., through etching) after a lithography process. A raised source/drain portion 830 of a source/drain region 840 (e.g., the raised source/drain portion 310 of the source/drain region 214 of the pull-up transistor PU1) is formed between the gate electrodes 810, 820 and exposed at least partially after the removal of the sacrificial dielectric material. A dielectric material 850 (e.g., the gate spacer 340) is formed on a sidewall of the gate electrode 820. Another dielectric material 860 (e.g., the gate insulator 320) covers a top surface of the gate electrode 820.

Another lithography process is performed, and part of the dielectric material 850 is removed (e.g., through etching) to expose part 880 of the sidewall of the gate electrode 820, as shown in FIG. 8(B).

A conductive material 870 is formed (e.g., through lithography, deposition, etc.) on the exposed sidewall of the gate electrode 820 and the exposed raised source/drain portion 830 of the source/drain region 840. A chemical-mechanical planarization (CMP) is performed to remove part of the conductive material 870, as shown in FIG. 8(C). The conductive material 870 is in contact with the exposed sidewall of the gate electrode 820 and the exposed raised source/drain portion 830 of the source/drain region 840 and is configured to electrically connect the sidewall of the gate electrode 820 and the source/drain region 840.

In certain embodiments, after the CMP process, a top surface of the conductive material 870 is substantially flush with a top surface of the dielectric material 860.

The conductive material 870 serves as an intra-connection structure (e.g., the intra-connection structure 230 as shown in FIG. 2).

FIG. 9(A)-FIG. 9(C) depict fragmentary sectional views showing another process for fabricating a device including an intra-connection structure, in accordance with some embodiments. One or more fabrication processes (e.g., lithography, deposition, and/or etching) may be carried out to yield a structure as shown in FIG. 9(A). For example, a sacrificial dielectric material (not shown) that is formed between gate electrodes 910, 920 (e.g., the gate electrodes 226 and 224 of the pull-up transistors PU1 and PU2, respectively) is removed (e.g., through etching) after a lithography process. A raised source/drain portion 930 of a source/drain region 940 (e.g., the raised source/drain portion 310 of the source/drain region 214 of the pull-up transistor PU1) is formed between the gate electrodes 910, 920 and exposed at least partially after the removal of the sacrificial dielectric material. A dielectric material 950 (e.g., the gate spacer 340) is formed on a sidewall of the gate electrode 920. Another dielectric material 960 (e.g., the gate insulator 320) covers a top surface of the gate electrode 920.

Another lithography process is performed, and part of the dielectric material 950 and part of the dielectric material 960 are removed (e.g., through etching) to expose part 980 of the sidewall and part 990 of the top surface of the gate electrode 920, as shown in FIG. 9(B).

A conductive material 970 is formed (e.g., through lithography, deposition, etc.) on the exposed sidewall and the exposed top surface of the gate electrode 920 and the exposed raised source/drain portion 930 of the source/drain region 940. A CMP process is performed to remove part of the conductive material 970, as shown in FIG. 9(C). The conductive material 970 is in contact with the exposed sidewall and the exposed top surface of the gate electrode 920 and the exposed raised source/drain portion 930 of the source/drain region 940, and is configured to electrically connect the sidewall and the top surface of the gate electrode 920 and the source/drain region 940.

In certain embodiments, after the CMP process, a top surface of the conductive material 970 is substantially flush with a top surface of the dielectric material 960.

The conductive material 970 serves as an intra-connection structure (e.g., the intra-connection structure 430 as shown in FIG. 4).

Figure 10:
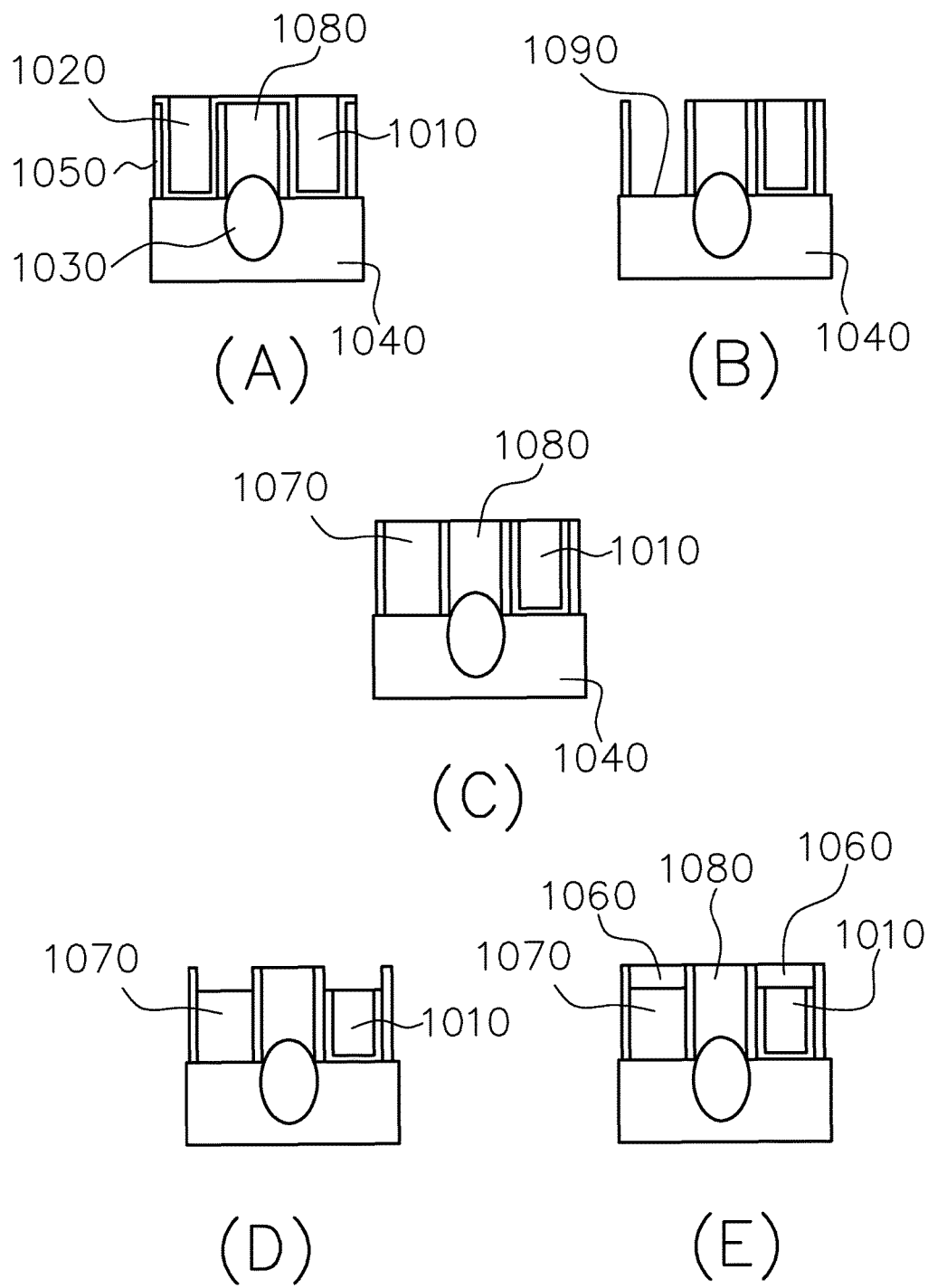
FIG. 10(A)-FIG. 10(E) depict fragmentary sectional views showing another process for fabricating a device including an intra-connection structure, in accordance with some embodiments.

FIG. 10(A)-FIG. 10(E) depict fragmentary sectional views showing another process for fabricating a device including an intra-connection structure, in accordance with some embodiments. One or more fabrication processes (e.g., lithography, deposition, and/or etching) may be carried out to yield a structure as shown in FIG. 10(A). For example, a raised source/drain portion 1030 of a source/drain region 1040 (e.g., the raised source/drain portion 310 of the source/drain region 214 of the pull-up transistor PU1) is formed between gate electrodes 1010, 1020 (e.g., the gate electrodes 226 and 224 of the pull-up transistors PU1 and PU2, respectively). As shown in FIG. 10(A), a dielectric material 1050 (e.g., the gate spacer 340 and the gate dielectric 330) covers at least part of the gate electrodes 1010, 1020, e.g., on bottom surfaces and sidewalls of the gate electrodes

1010, 1020. A sacrificial dielectric material 1080 is formed on the raised source/drain portion 1030 of the source/drain region 1040.

A lithography process is performed, and part of the gate electrode 1020, as well as the dielectric material 1050 on the bottom surface and the sidewall thereof, is removed (e.g., through etching) to expose part (not shown) of the sidewall of the gate electrode 1020 (e.g., the third sidewall portion 260 of the sidewall of the gate electrode 224 of the pull-up transistor PU2, as shown in FIG. 6) and part 1090 of the source/drain region 1040, as shown in FIG. 10(B).

A conductive material 1070 is formed (e.g., through lithography, deposition, etc.) on the exposed sidewall of the gate electrode 1020 and the exposed source/drain region. A CMP process is performed to remove part of the conductive material 1070, as shown in FIG. 10(C). The conductive material 1070 is in contact with the exposed sidewall of the gate electrode 1020 and the exposed source/drain region and is configured to electrically connect the sidewall of the gate electrode 1020 and the source/drain region 1040.

In certain embodiments, after the CMP process, the conductive material 1070 does not cover any part of a top surface of the sacrificial dielectric material 1080 and a top surface of the gate electrode 1010.

The conductive material 1070 serves as an intra-connection structure (e.g., the intra-connection structure 630 as shown in FIG. 6).

An etch back process is performed to remove part of the conductive material 1070, part of the gate electrode 1010, and part of the gate electrode 1020, as shown in FIG. 10(D).

Another dielectric material 1060 (e.g., the gate insulator 320) is formed (e.g., through deposition, etc.) on the conductive material 1070 and the gate electrodes 1010, 1020. A CMP process is performed to remove part of the dielectric material 1060, as shown in FIG. 10(E).

In certain embodiments, after the CMP process, the dielectric material 1060 does not cover any part of a top surface of the sacrificial dielectric material 1080.

Figure 11:
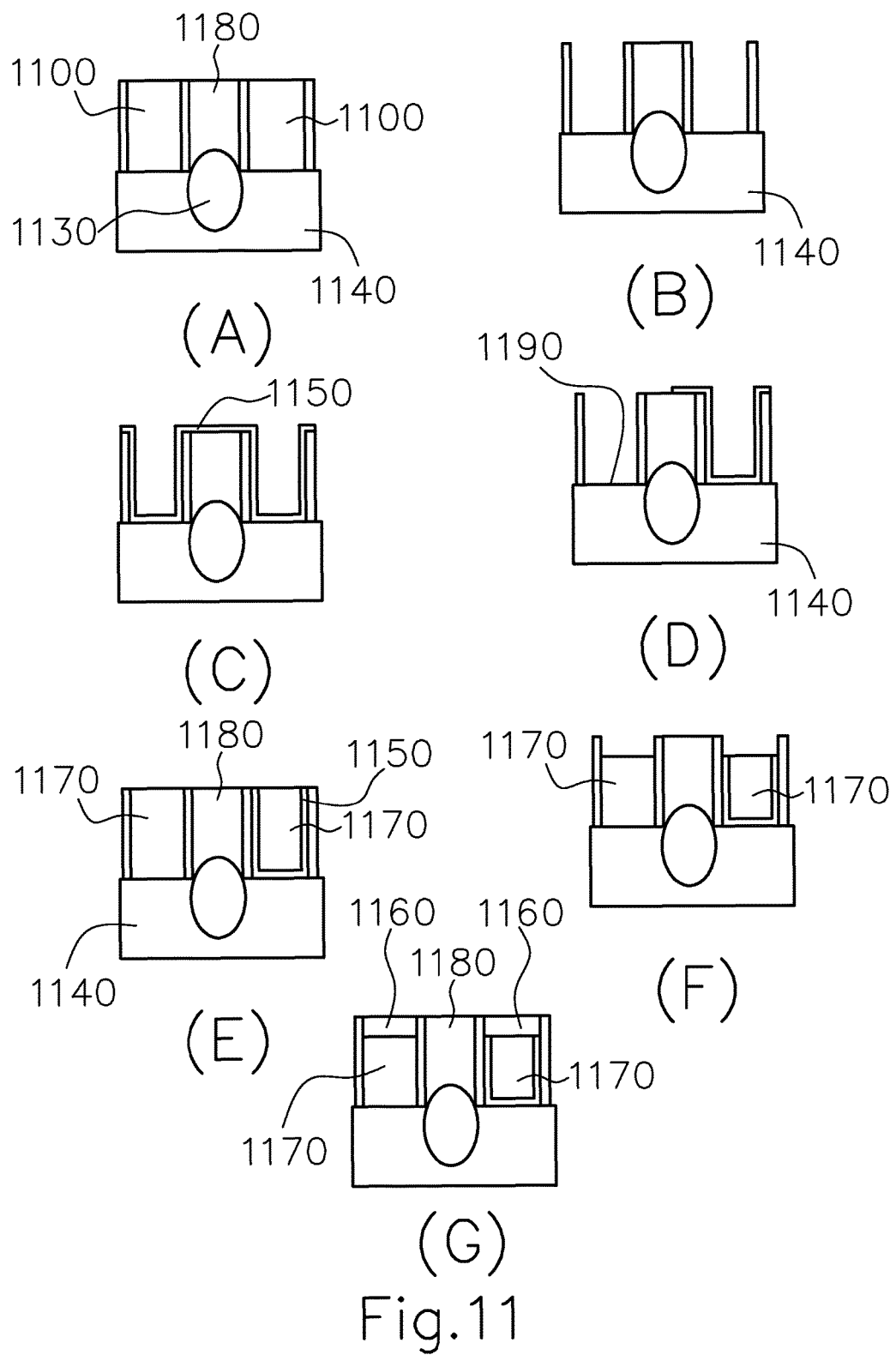
FIG. 11(A)-FIG. 11(G) depict fragmentary sectional views showing another process for fabricating a device including an intra-connection structure, in accordance with some embodiments.
Figure 12A:
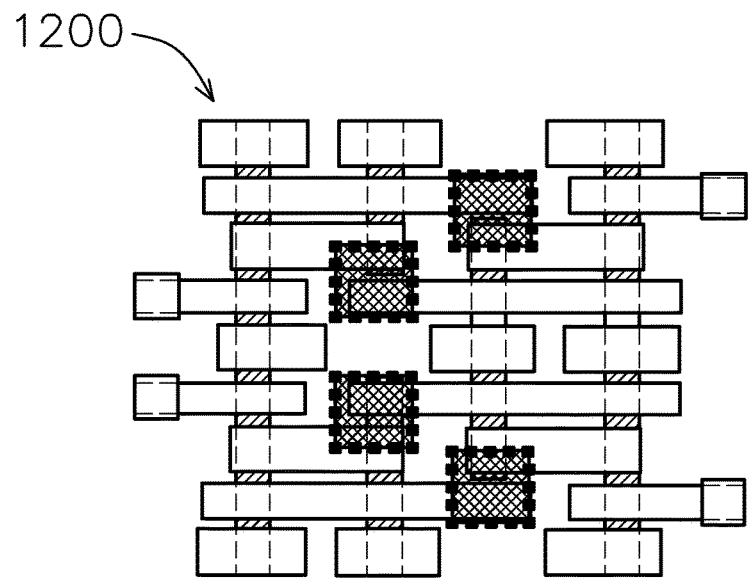
FIG. 12(A)-FIG. 12(E) depict example diagrams showing different masks for fabricating a device including an intra-connection structure, in accordance with some embodiments.
Figure 12B:
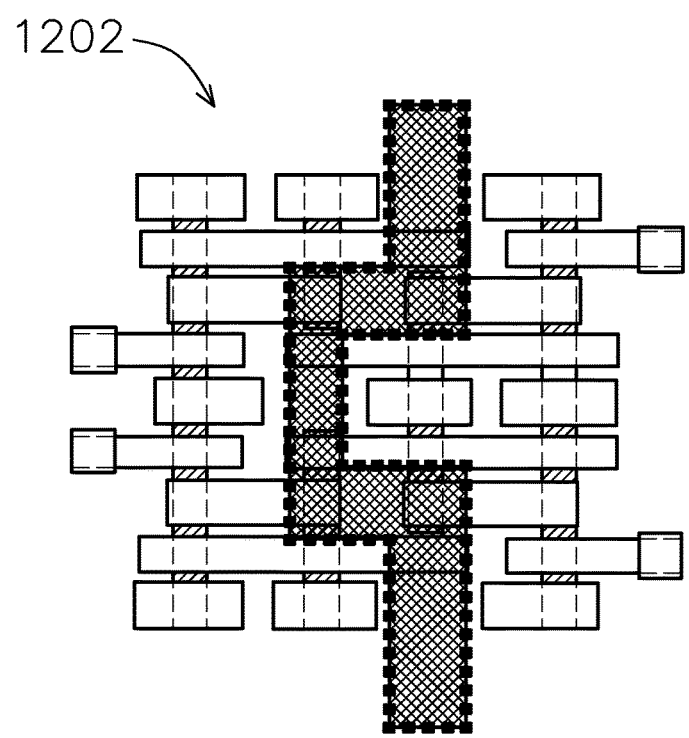
Figure 12C:
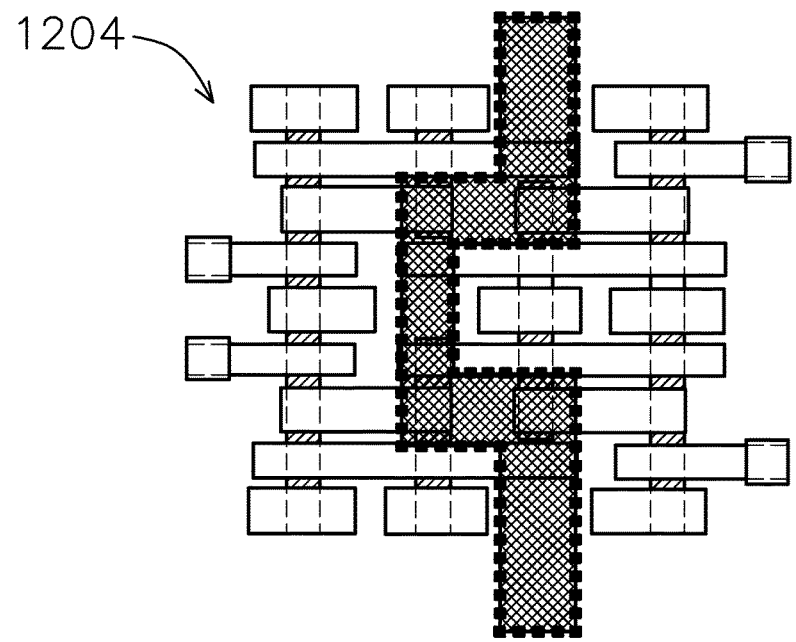
Figure 12D:
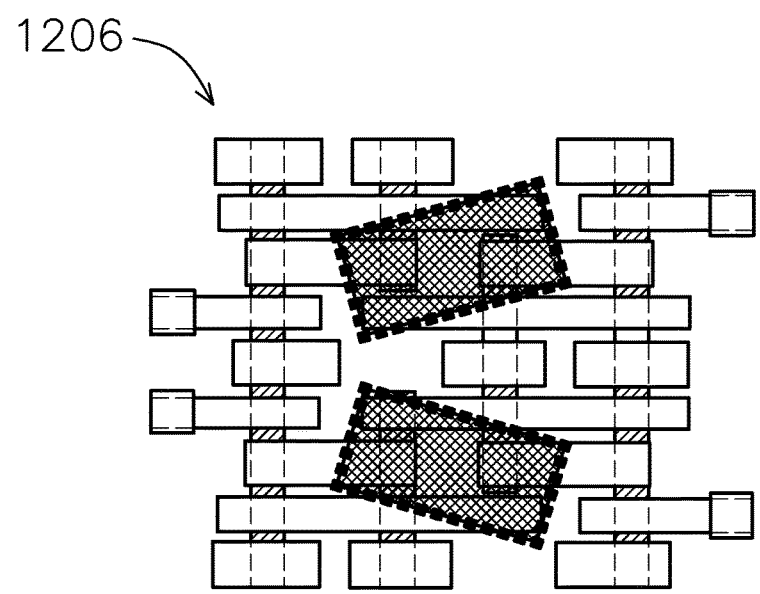
Figure 12E:
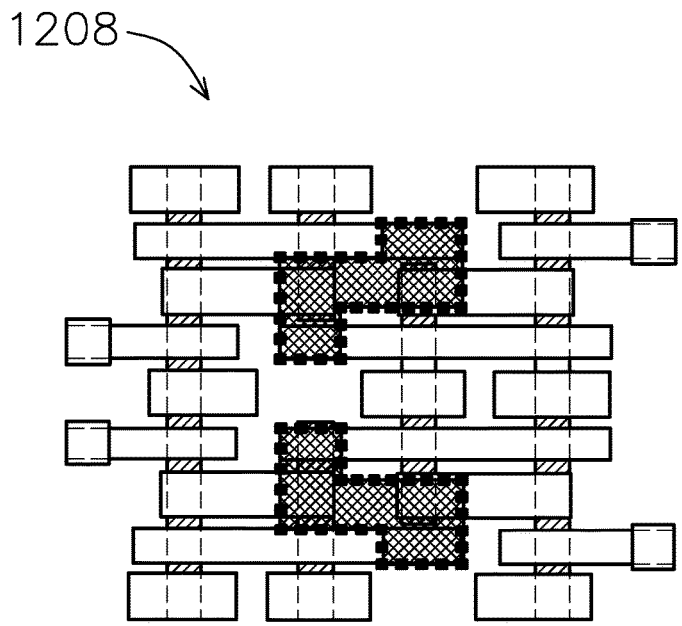

FIG. 11(A)-FIG. 11(G) depict fragmentary sectional views showing another process for fabricating a device including an intra-connection structure, in accordance with some embodiments. One or more fabrication processes (e.g., lithography, deposition, and/or etching) may be carried out to yield a structure as shown in FIG. 11(A). For example, a raised source/drain portion 1130 of a source/drain region 1140 (e.g., the raised source/drain portion 310 of the source/drain region 214 of the pull-up transistor PU1) is formed between dummy gate electrodes 1100. A sacrificial dielectric material 1180 is formed on the raised source/drain portion 1130 of the source/drain region 1140.

Another lithography process is performed, and the dummy gate electrodes 1100 are removed (e.g., through etching), thereby resulting in the structure as shown in FIG. 11(B). A dielectric material 1150 (e.g., the gate spacer 340 and the gate dielectric 330) is formed conformably over the structure of FIG. 11(B), as shown in FIG. 11(C).

Another lithography process is performed, and part of the dielectric material 1150 is removed to expose part 1190 of the source/drain region 1140, as shown in FIG. 11(D).

A conductive material 1170 is formed (e.g., through lithography, deposition, etc.) on the exposed source/drain region and the dielectric material 1150. A CMP process is performed to remove part of the conductive material 1170, as shown in FIG. 11(E). Part of a bottom surface of the conductive material 1170 is in contact with the exposed source/drain region, thereby connecting electrically the bottom surface of the conductive material 1170 and the source/drain region 1140.

In certain embodiments, after the CMP process, the conductive material 1170 does not cover any part of a top surface of the sacrificial dielectric material 1180.

The conductive material 1170 that is formed on the dielectric material 1150 serves as gate electrodes (e.g., the gate electrodes 226, 224 of the pull-up transistors PU1 and PU2), and the conductive material 1170 that is formed on the exposed source/drain region serves as an intra-connection structure (e.g., the intra-connection structure 630 as shown in FIG. 6).

An etch back process is performed to remove part of the conductive material 1170, as shown in FIG. 11(F).

Another dielectric material 1160 (e.g., the gate insulator 320) is formed (e.g., through deposition, etc.) on the conductive material 1170. A CMP process is performed to remove part of the dielectric material 1160, as shown in FIG. 11(G).

In certain embodiments, after the CMP process, the dielectric material 1160 does not cover any part of a top surface of the sacrificial dielectric material 1180.

FIG. 12(A)-FIG. 12(E) depict example diagrams showing different masks for fabricating a device structure including an intra-connection structure, in accordance with some embodiments. As shown in FIG. 12(A)-FIG. 12(E), the masks 1200, 1202, 1204, 1206, and 1208 can all be used for defining an intra-connection structure by removing part of a dielectric material on a gate electrode. Specifically, the mask 1200 includes simple pattern shapes with small pattern areas, and the mask 1202 may be implemented by a single patterning. In addition, the mask 1204 includes simple shapes with large pattern areas, and both the mask 1206 and the mask 1208 include large pattern areas.

Figure 13:
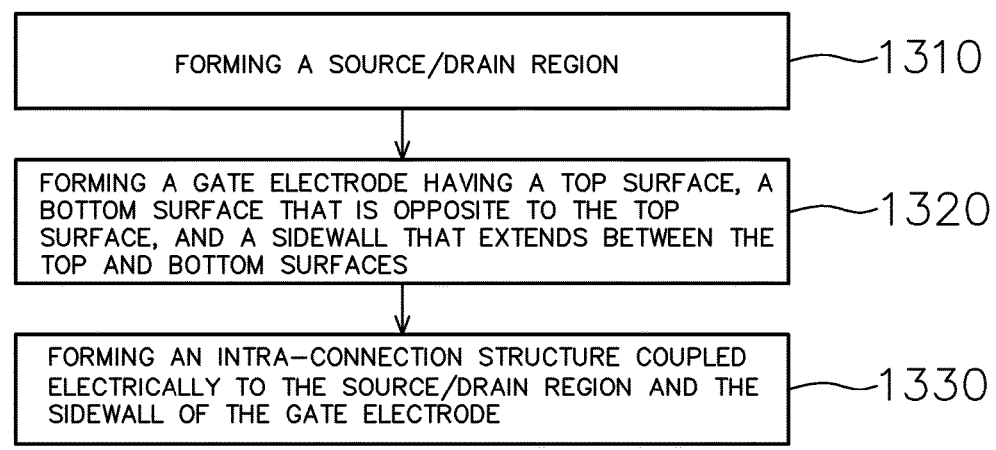
FIG. 13 depicts an example flow chart for fabricating a device including an intra-connection structure, in accordance with some embodiments.

FIG. 13 depicts an example flow chart for fabricating a device including an intra-connection structure, in accordance with some embodiments. At 1310, a source/drain region is formed, for example, on a substrate. At 1320, a gate electrode is formed, for example, on the source/drain region and the substrate. The gate electrode has a top surface, a bottom surface that is opposite to the top surface thereof, and a sidewall that extends between the top and bottom surfaces thereof. At 1330, an intra-connection structure is formed that is coupled electrically to the source/drain region and the sidewall of the gate electrode.

According to one embodiment, a device includes a source/drain region, a gate electrode, and an intra-connection structure. The gate electrode has a top surface, a bottom surface that is opposite to the top surface thereof, and a sidewall that extends between the top and bottom surfaces thereof. The intra-connection structure is coupled electrically to the source/drain region and the sidewall of the gate electrode.

According to another embodiment, a device includes a source/drain region and a gate electrode. The gate electrode has a bottom surface coupled electrically to the source/drain region.

According to yet another embodiment, a method includes: forming a source/drain region; forming a gate electrode having a top surface, a bottom surface that is opposite to the top surface, and a sidewall that extends between the top and bottom surfaces; and forming an intra-connection structure coupled electrically to the source/drain region and the sidewall of the gate electrode.

According to still yet another embodiment, a method includes forming a source/drain region, and forming a gate electrode having a bottom surface that is coupled electrically to the source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    first and second source/drain (S/D) regions;
    a gate electrode that
        (i) is above the first and second S/D regions and
        (ii) has first and second sidewall portions that are respectively located at opposite sides of the gate electrode, and that are each extending in a single direction and located on one side of the gate electrode;
    a first gate spacer that covers part of the first sidewall portion and leaves a section of the first sidewall portion exposed and projects directly upward beyond a top of the gate electrode;
    a second gate spacer that covers the second sidewall portion and projects directly upward beyond the top of the gate electrode;
    a first intra-connection structure physically and directly contacting both the first S/D region and the exposed section of the first sidewall portion;
    a second intra-connection structure physically and directly contacting both the second S/D region and the first gate spacer, and spaced from the first sidewall portion by the first gate spacer; and
    a gate insulator that extends vertically upward from the top of the gate electrode to a top of the gate insulator and extends horizontally from the first gate spacer to the second gate spacer such that the gate insulator has a same width as the gate electrode, and tops of the first gate spacer, the second gate spacer, the gate insulator, and the first intra-connection structure are all at a same level.

2. The device of claim 1, further comprising a power voltage (Vdd) contact, wherein the gate insulator is between the first intra-connection structure and the Vdd contact.

3. The device of claim 1, further comprising an active area, in which the first source/drain region is disposed, extending in a first direction, wherein the gate electrode extends in a second direction transverse to the first direction.

4. The device of claim 3, further comprising:
    a second active area, in which the second source/drain region is disposed, extending in the first direction.

5. The device of claim 1, further comprising:
    a node contact coupling electrically the first S/D region to a fourth source/drain region.

6. The device of claim 5, further comprising a second gate electrode, wherein the node contact is disposed between the gate electrode and the second gate electrode.

7. The device of claim 5, wherein the gate electrode is disposed between the node contact and a Vdd contact.

8. The device of claim 5, further comprising:
    a third source/drain region; and
    a ground voltage (Vss) contact coupled electrically to the third source/drain region, wherein the gate electrode is disposed between the node contact and the Vss contact.

9. The device of claim 1, wherein the gate electrode includes a top surface and an opposite bottom surface, and each of the first and second sidewall portions extends from the bottom surface to the top surface.

10. The device of claim 1, wherein the first gate spacer extends across the second S/D region.

11. The device of claim 1, wherein the gate electrode further includes third and fourth sidewall portions located at opposite ends of the gate electrode, wherein each of the third and fourth sidewall portions extends from the first sidewall portion to the second sidewall portion, and the gate spacer covers the entire lengths of the second, third, and fourth sidewall portions.

12. The device of claim 1, wherein the first intra-connection structure physically and directly contacts the exposed section from a bottom of the gate electrode to the top of the gate electrode, and the second intra-connection structure physically and directly contacts the gate spacer from a bottom of the gate spacer to the top of the gate electrode.

13. The device of claim 1, wherein the first gate spacer extends across the first S/D region.

14. A method comprising:
    forming first and second source/drain (S/D) regions;
    forming a gate electrode that
        (i) is above the first and second S/D regions and
        (ii) has first and second sidewall portions that are respectively located at opposite sides of the gate electrode, and that are each extending in a single direction and located on one side of the gate electrode;
    forming a first gate spacer that covers part of the first sidewall portion and leaves a section of the first sidewall portion exposed and projects directly upward beyond a top of the gate electrode;
    forming a second gate spacer that covers the second sidewall portion and projects directly upward beyond the top of the gate electrode;
    forming a first intra-connection structure physically and directly contacting both the first S/D region and the exposed section of the first sidewall portion;
    forming a second intra-connection structure physically and directly contacting both the second source/drain region and the first gate spacer, and spaced from the first sidewall portion by the first gate spacer; and
    forming a gate insulator that extends vertically upward from the top of the gate electrode to a top of the gate insulator and extends horizontally from the first gate spacer to the second gate spacer such that the gate insulator has a same width as the gate electrode, and tops of the first gate spacer, the second gate spacer, the gate insulator, and the first intra-connection structure are all at a same level.

15. The method of claim 14, further comprising:
    forming an active area in which the first source/drain region is disposed, such that the active area extends in a first direction; and
    forming the gate electrode such that the gate electrode extends in a second direction transverse to the first direction.

16. The method of claim 15, further comprising:
forming a second active area in which the second source/drain region is disposed, such that the second active area extends in the first direction;
forming a second gate electrode that extends in the second direction; and
coupling electrically the second source/drain region and the second gate electrode with the second intra-connection structure.

17. The method of claim 14, further comprising:
forming a third source/drain region; and
coupling electrically the first source/drain region and the third source/drain region to a node contact.

18. A device comprising:
first and second source/drain (S/D) regions;
a gate electrode that is above the first and second S/D regions and has first and second side surfaces located at opposite sides of the gate electrode, each of the first and second side surfaces extending in a single direction across the first and second S/D regions;
a first spacer that covers part of the first side surface and leaves a section of the first side surface exposed and projects directly upward beyond a top of the gate electrode;
a second spacer that covers the second side surface and projects directly upward beyond the top of the gate electrode;
a first intra-connection structure that is physically and directly contacting both the first S/D region and the exposed section of the first side surface;
a second intra-connection structure that is physically and directly contacting both the second S/D region and the first spacer and is spaced from the first side surface by the first spacer;
a gate insulator that extends vertically upward from the top of the gate electrode to a top of the gate insulator and extends horizontally from the first spacer to the second spacer such that the gate insulator has a same width as the gate electrode, and tops of the first spacer, the second spacer, the gate insulator, and the first intra-connection structure are all at a same level.

19. The device of claim 18, wherein the second spacer extends across the second S/D region.

20. The device of claim 18, wherein the the first and second side surfaces extend in said single direction from a first end surface of the gate electrode to a second end surface of the gate electrode, and wherein the second spacer covers an entire length of the second side surface from the first end surface to the second end surface.

21. The device of claim 18, wherein the gate electrode is a first gate electrode, and the device further comprises:
a second gate electrode that is above the first and second S/D regions and has a side surface that extends in said single direction across the first and second S/D regions; and
a third spacer that covers part of the second gate electrode's side surface and leaves a section of the second gate electrode's side surface exposed;
wherein the first intra-connection structure physically and directly contacts the third spacer and is spaced from the second gate electrode's side surface by the third spacer; and
wherein the second intra-connection structure physically and directly contacts the exposed section of the second gate electrode's side surface.

* * * * *